United States Patent
Kang et al.

(10) Patent No.: US 6,781,211 B2
(45) Date of Patent: Aug. 24, 2004

(54) PHOTODIODE HAVING AN ACTIVE REGION SHAPED IN A CONVEX LENS

(75) Inventors: Hwa-Young Kang, Suwon-shi (KR); Jung-Kee Lee, Suwon-shi (KR)

(73) Assignee: Samsung Electronics Co., Ltd., Suwon-si (KR)

( * ) Notice: Subject to any disclaimer, the term of this patent is extended or adjusted under 35 U.S.C. 154(b) by 0 days.

(21) Appl. No.: 10/346,315

(22) Filed: Jan. 17, 2003

(65) Prior Publication Data

US 2003/0155593 A1 Aug. 21, 2003

(30) Foreign Application Priority Data

Feb. 18, 2002 (KR) .................................. 10-2002-0008509

(51) Int. Cl.$^7$ ..................... H01L 31/0328; H01L 31/00; H01L 21/00
(52) U.S. Cl. ..................... 257/436; 257/432; 257/448; 257/457; 257/184; 257/185; 438/24; 438/48; 438/69; 438/77
(58) Field of Search .............................. 257/184, 185, 257/432, 436, 21, 448, 457, 459, 465, 466; 438/24, 69, 77, 718, 735, 48

(56) References Cited

U.S. PATENT DOCUMENTS 4,532,537 A * 7/1985 Kane .......................... 357/30

FOREIGN PATENT DOCUMENTS

JP 4-246867 * 9/1992

* cited by examiner

Primary Examiner—Donghee Kang
(74) Attorney, Agent, or Firm—Cha & Reiter, L.L.C.

(57) ABSTRACT

Disclosed is a photodiode with improved light-receiving efficiency and coupling effect with an optical fiber, whose capacitance may be decreased. The inventive photodiode includes a substrate; a buffer layer and a light-absorbing layer laminated in sequence on the substrate; an epitaxial layer formed on the upper surface of the light absorbing layer and having an active region with a surface in a convex lens shape so that it has greater surface area and more effective light-receiving area than an active region defined in a two-dimensional plane, the active region further having a convex surface can harvest light with its convex-lens characteristics; a dielectric layer formed on the upper surface of the epitaxial layer; a first metal electrode formed on an upper surface of the dielectric layer; and, a second metal electrode formed on an under surface of the substrate.

6 Claims, 7 Drawing Sheets

PHOTODIODE HAVING AN ACTIVE REGION SHAPED IN A CONVEX LENS

CLAIM OF PRIORITY

This application claims priority to an application entitled "PHOTODIODE AND METHOD OF MANUFACTURING THE SAME," filed with the Korean Intellectual Property Office on Feb. 18, 2002 and assigned Serial No. 2002-8509, the contents of which are hereby incorporated by reference.

BACKGROUND OF THE INVENTION

1. Field of the Invention

The present invention relates to a photodiode which can be used for a light-receiving element and a method of manufacturing the same.

2. Description of the Related Art

Recently, optical communication techniques have been rapidly applied to actual living. Accordingly, high-speed, low-price optical-data-link modules are greatly required.

Photodiodes are a core part of optical-data-link modules, and increasing their modulation rate would result in an increased transmission capacity. A factor of the modulation rate of photodiodes is the capacitance of a chip. In order to increase the modulation rate of photodiodes, the capacitance of the chip must be decreased. In order to decrease the capacitance, the area of the active region must be reduced. However, the light-receiving area will be reduced in proportion to the reduction of the area of the active region. If the light-receiving area is reduced, the photoelectric transformation efficiency will be lowered. The coupling effect with an optical fiber also will be lowered during a packaging process. As a result, the degree of freedom of subsequent processes will be lowered resulting in various problems. Therefore, there is a need to improve the light-receiving efficiency and the coupling effect with an optical fiber, while decreasing the capacitance of the chip.

FIGS. 1 and 2 are sectional views showing the structures of conventional photodiodes.

In the photodiode as shown in FIG. 1, an active region 9 having a planar structure generates a light-induced current. A buffering layer 2, a light absorbing layer 3, and an epitaxial layer 4 are formed in sequence on a substrate 1 by metallo-organic chemical-vapor deposition. A SiNx layer 5 is then deposited on the epitaxial layer 4 and patterned to be used as a diffusion mask for depositing a diffusion source on a position where the active region will be formed. A diffusion process is then performed to form a plane surface junction. Subsequently, a SiO2 layer 6, a p-type electrode 7, and an n-type electrode 10 are formed.

In the prior art explained above, the active region 9 generating a light-induced current has a planar structure. In practical use, a front side illumination, which irradiates light at the surface on which a diffusion process has been performed, is used to irradiate light to the active region. Therefore, the area of the active region is identical to that of the light-receiving part. If the area of the active region is reduced to increase the modulation rate of the photodiode, the light-receiving area also will be reduced. Consequently, the photoelectric transformation efficiency and the coupling effect with an optical fiber also will be lowered causing such problems as lowering the degree of freedom in subsequent processes.

In the photodiode as shown in FIG. 2, a micro-lens 8 is formed on a surface of the substrate 1 opposite the surface on which the active region 9 is formed. The purpose is to utilize the back-side illumination for the incidence of light to the active region 9.

However, in the prior art mentioned above, the rear side of the substrate must be processed after grinding a wafer to have the same thickness as a final chip. Therefore, the pattern between the front and rear sides of the chip must be aligned precisely.

SUMMARY OF THE INVENTION

The present invention provides a light-receiving diode, which can increase the light-receiving area and improve the light-receiving efficiency, while decreasing the capacitance, and to provide a method for manufacturing the light-receiving diode.

One aspect of the present invention is to provide a light-receiving diode, which can improve the light-receiving efficiency without performing a process on the rear side of a thin wafer or a pattern-alignment process between the front and rear sides of the wafer.

According to one embodiment of the present invention, a photodiode includes: a substrate; a buffer layer and a light-absorbing layer laminated in sequence on the substrate; an epitaxial layer formed on the upper surface of the light-absorbing layer, having an active region with a surface in a convex-lens shape; a dielectric layer formed on the upper surface of the epitaxial layer; a first metal electrode formed on the upper surface of the dielectric layer; and a second metal electrode formed on the under surface of the substrate.

According to another embodiment of the present invention, a method for manufacturing a photodiode is provided and includes the steps of: forming a buffer layer, a light-absorbing layer, and an epitaxial layer in sequence on a substrate; selectively etching said epitaxial layer of an active region to form a surface in a convex-lens shape; forming a dielectric layer on the upper surface of the epitaxial layer excluding the active region; performing a diffusion process using the dielectric layer as a diffusion mask to form a diffusion layer on the active region in the convex-lens shape; forming a first metal electrode on the top of one side of the dielectric layer; and, forming a second metal electrode on the under surface of the substrate.

In the embodiment, the step of selectively etching the epitaxial layer of an active region to form a surface in a convex lens shape is achieved by: applying a photosensitive film on the upper surface of the epitaxial layer, and forming a photosensitive mask pattern on the upper surface of the epitaxial layer excluding the active region by an exposure and development process; and, wet-etching the epitaxial layer in a lens-forming etching solution.

DETAILED DESCRIPTION OF THE PREFERRED EMBODIMENT

Figure 1:
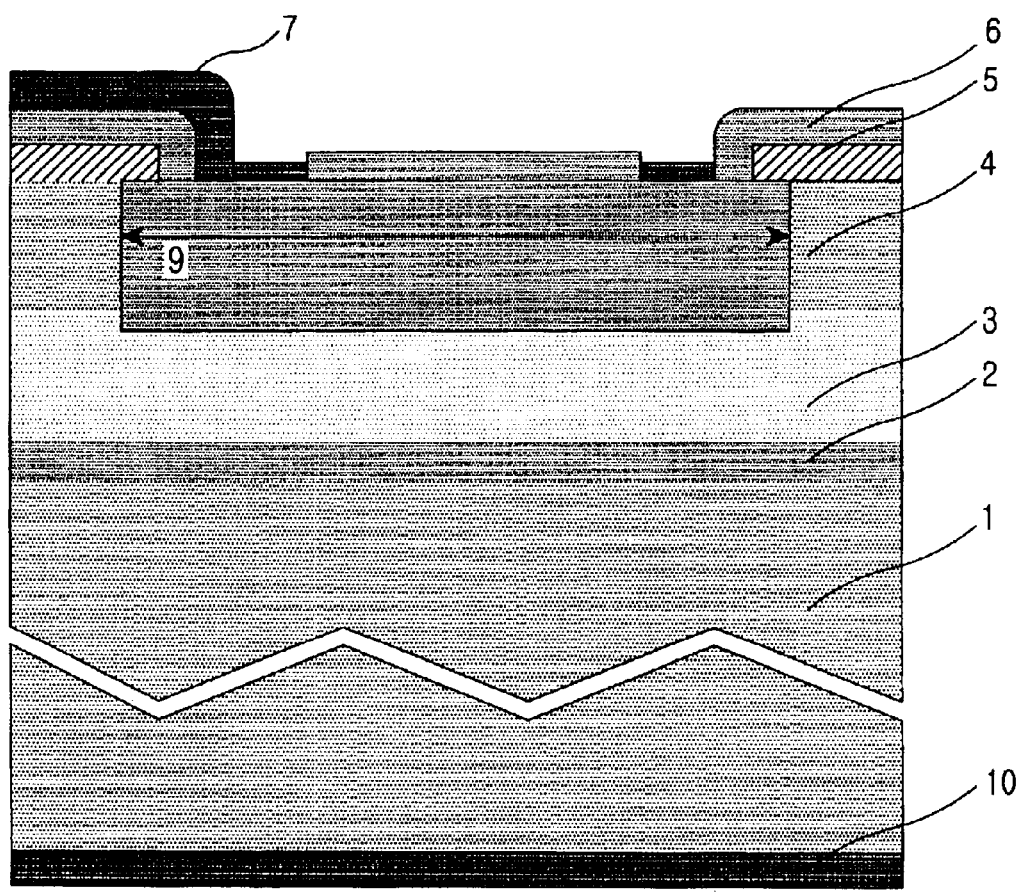
FIG. 1 is a cross-sectional view showing the structure of a photodiode according to a prior art.
Figure 2:
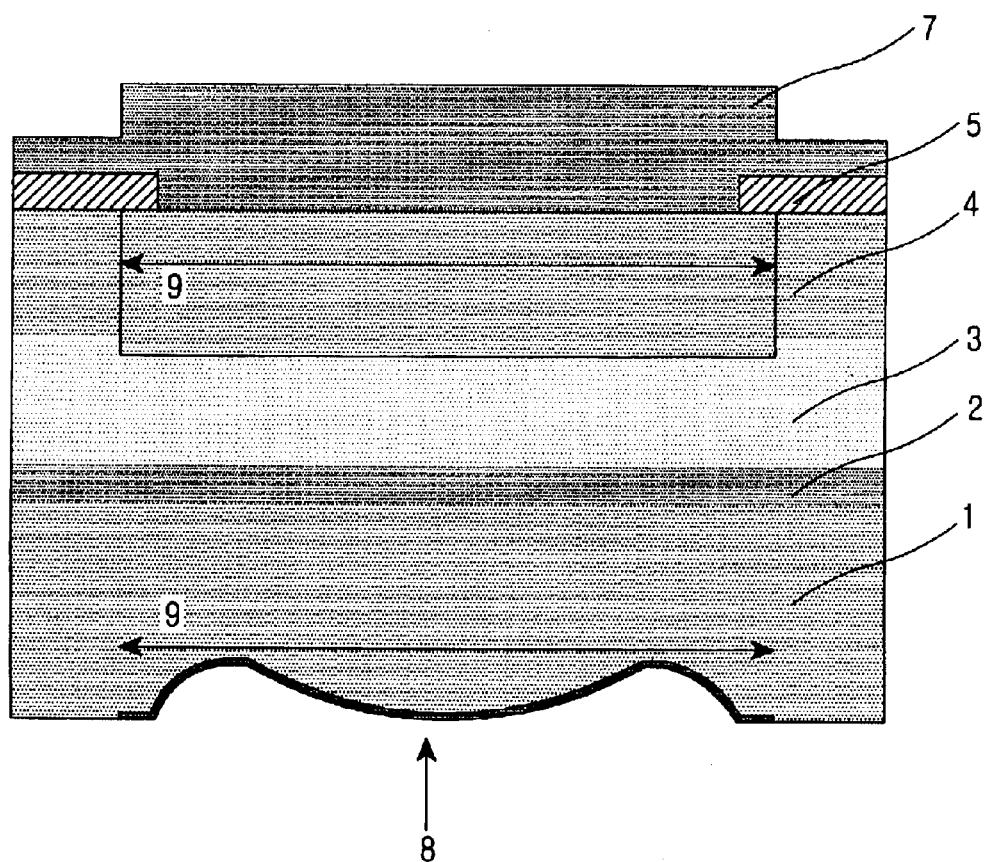
FIG. 2 is a cross-sectional view showing the structure of a photodiode according to another prior-art technique.

In accordance with the present invention, a preferred embodiment of the present invention will be described in detail with reference to FIGS. 3a–3d and 4. In the drawings, the same element, although depicted in different drawings, will be designated by the same reference numeral or character. For the purposes of clarity and simplicity, a detailed description of known functions and configurations incorporated herein will be omitted as it may make the subject matter of the present invention unclear.

Figure 3A:
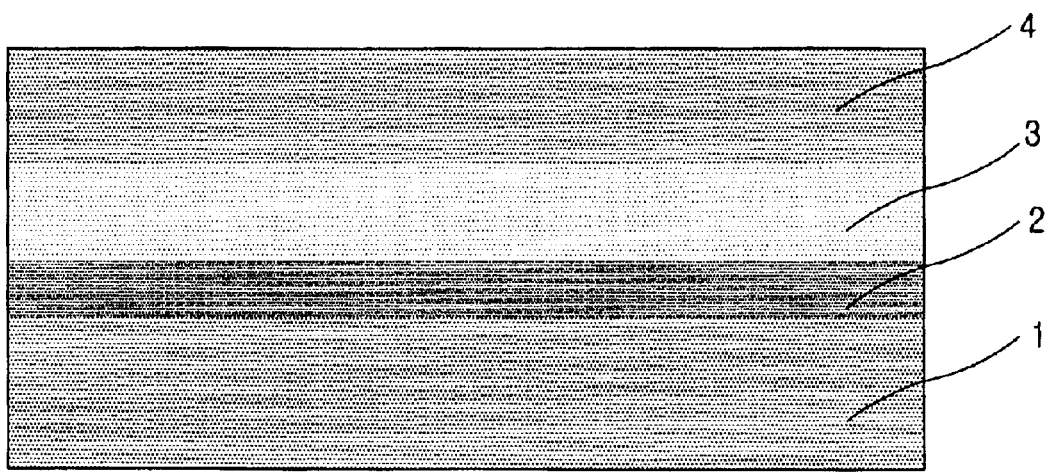
FIGS. 3a–3d are cross-sectional views showing the process of forming a photodiode according to one embodiment of the present invention.

As shown in FIG. 3a, an InP buffer layer 2, an InGaAs light absorbing layer 3, an InP epitaxial layer 4 are formed in sequence on an InP substrate 1 by metallo-organic chemical-vapor deposition. The buffer layer 2 has the same crystal structure as the substrate 1. As such, the buffer layer 2 has improved quality and fewer defects and mismatches, thus facilitating the formation of the light-absorbing layer 3 on the upper surface thereof.

Figure 3B:
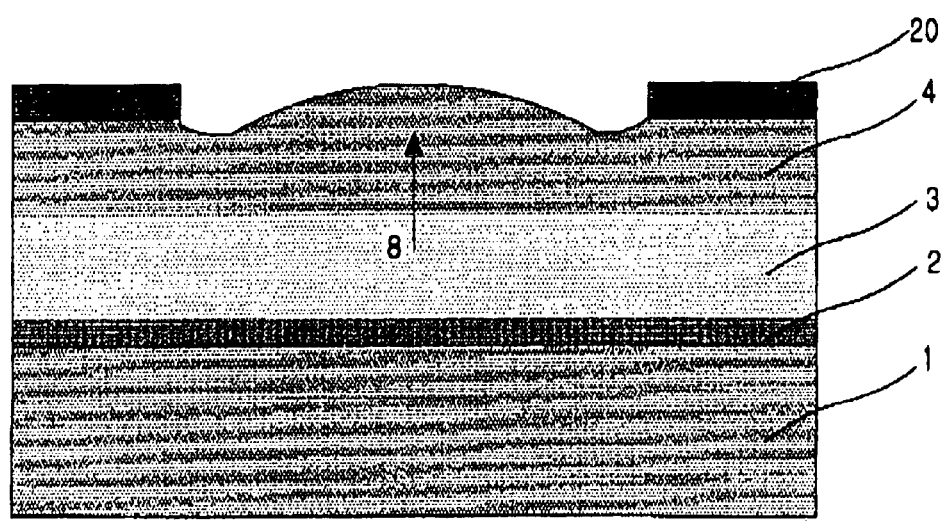
Figure 4:
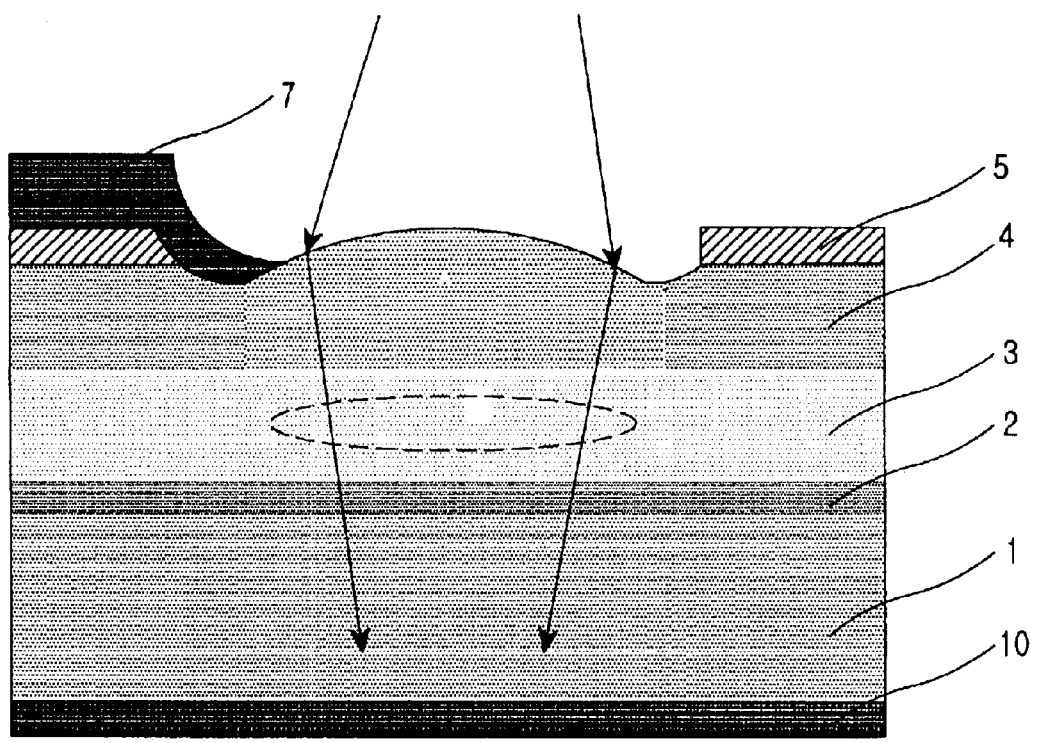
FIG. 4 shows the input direction of a light signal in a photodiode of the present invention.

As shown in FIG. 3b, a photo-resistor is coated on the upper surface of the entire structure mentioned above. A photosensitive film-mask pattern 20 is formed on the upper surface of the epitaxial layer 4 excluding the active region. The InP epitaxial layer 4 is then processed by wet etching in methanol bromide, which is an etching reagent for forming a lens. In this process, the edges of the active region of the InP epitaxial layer 4 are more rapidly etched than the center of the active region. As a result, the surface of the active region forms a convex micro-lens 8. As the active region has a surface in a convex-lens shape, its surface area and effective light-receiving area are much greater than an active region defined in a two-dimensional plane. FIG. 4 shows the active region having a convex surface collecting light permitted by its convex-lens characteristics. In this drawing, the arrows refer to the input directions of a light signal.

Figure 3C:
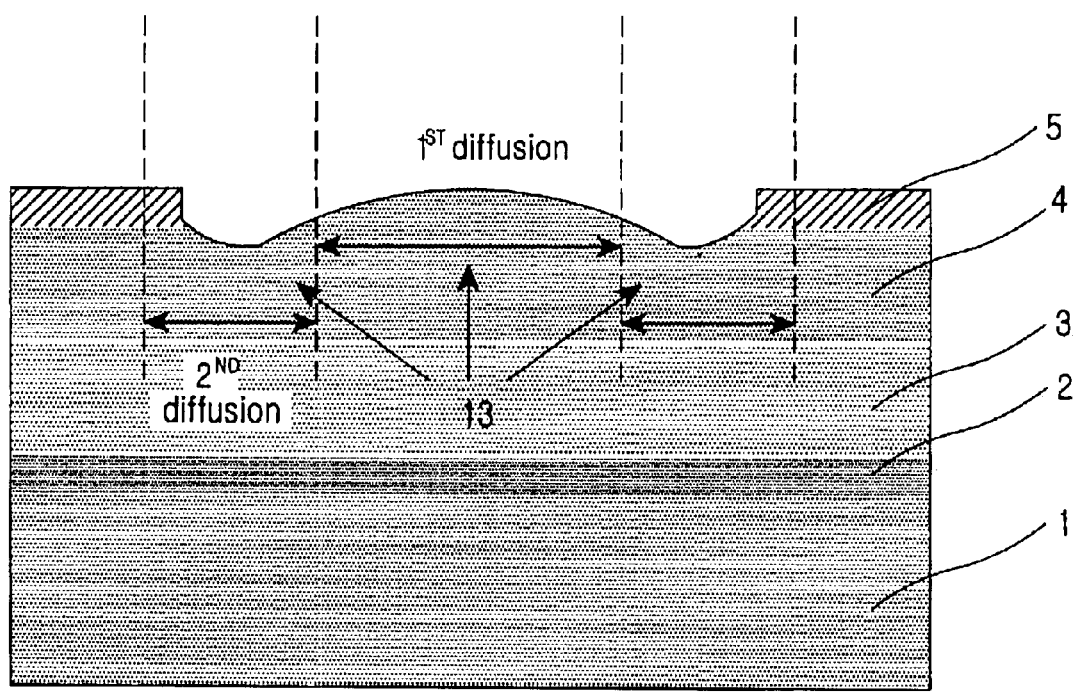
Figure 3D:
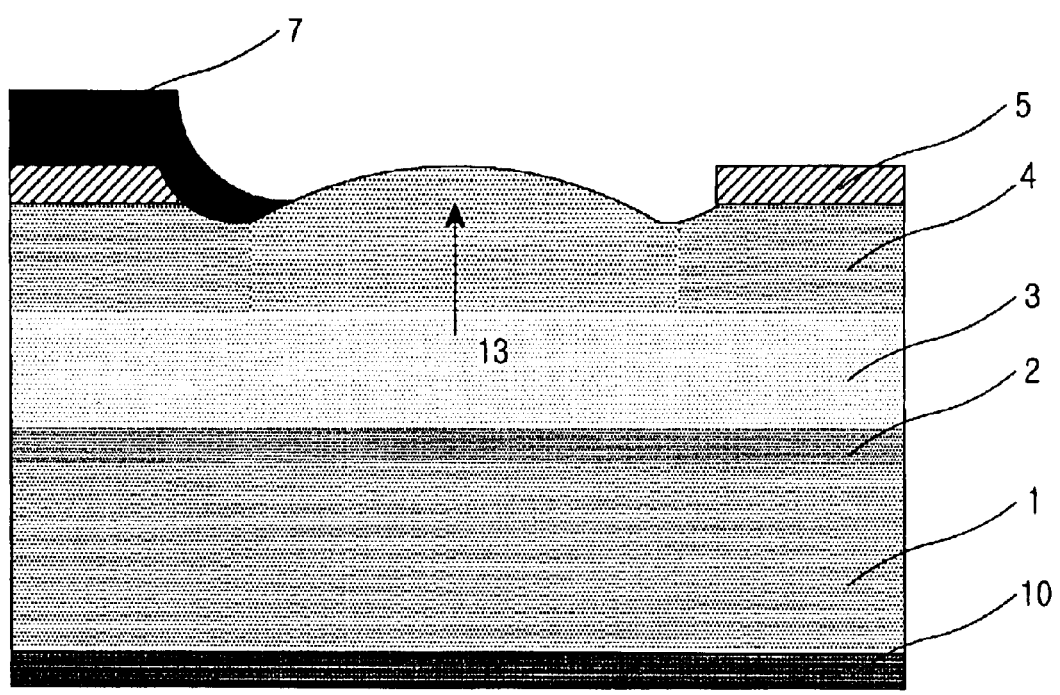

Subsequently, as shown in FIG. 3c, the photosensitive film pattern 20 is removed, and a SiN dielectric layer 5 is formed on the upper surface of the InP epitaxial layer 4, excluding the active region by general SiN (SiO$_2$) deposition, masking, and etching processes. Also, a diffusion layer 13 is formed on the micro-lens 8 by a Zn diffusion process. As the micro-lens 8 is not a flat plane, the area to be diffused is divided as shown in the drawing. First and second diffusion processes (or more if required) are performed in the divided areas. The diffusion layer formed by a first diffusion process will get deeper as a subsequent diffusion process is performed. Therefore, a uniform diffusion layer can be formed over the entire micro-lens 8 under proper diffusion conditions.

Finally, a P-metal electrode 7 is formed on the upper surface of one side of the dielectric layer 5, and an N-metal electrode 10 is formed on the undersurface of the InP substrate 1.

As described above, the present invention forms the active region to have a surface in a convex-lens shape so that the active region can have a greater, effective light-receiving area than an active region defined in a two-dimensional plane, thereby increasing the actual light-receiving area while maintaining a constant capacitance of a chip.

In addition, the present invention can improve the light-coupling effect, because it collects light into the light-absorbing layer more efficiently with its convex-lens characteristics by collecting an input light signal that is spread out or if the signal path is slightly deviated.

Furthermore, as the active region and the lens are formed together on one side of a wafer, the manufacturing process is simplified. That is, a pattern-alignment process between the front and rear sides of a chip is not required.

While the invention has been shown and described with reference to a preferred embodiment thereof, it will be understood by those skilled in the art that various changes in form and details may be made therein without departing from the spirit and scope of the invention as defined by the appended claims. Therefore, this invention is not to be unduly limited to the embodiment set forth herein, but to be defined by the appended claims and equivalents thereof.

What is claimed is:

1. A photodiode comprising:

a substrate;

a buffer layer and a light-absorbing layer limited in sequence on the substrate;

an epitaxial layer having an active region shaped in a convex lens formed on an upper surface of the light absorbing layer;

a dielectric layer formed on an upper surface of the epitaxial layer;

a first metal electrode formed on an upper surface of the dielectric layer; and, a second metal electrode formed on an under surface of the substrate.

2. The photodiode according to claim 1, wherein said epitaxial layer is formed from InP.

3. The photodiode according to claim 1, wherein the buffer layer comprises same crystal structure as the substrate.

4. The photodiode according to claim 1, wherein the active region of the epitaxial layer defines a light-receiving area.

5. The photodiode according to claim 1, wherein the first metal electrode comprises a P-metal electrode.

6. The photodiode according to claim 1, wherein the second metal electrode comprises an N-metal electrode.

* * * * *